United States Patent
Tanabe et al.

(10) Patent No.: US 12,043,898 B2
(45) Date of Patent: Jul. 23, 2024

(54) FILM FORMATION APPARATUS AND MOISTURE REMOVAL METHOD THEREOF

(71) Applicant: SHIBAURA MECHATRONICS CORPORATION, Yokohama (JP)

(72) Inventors: Shohei Tanabe, Yokohama (JP); Koji Yoshimura, Yokohama (JP)

(73) Assignee: SHIBAURA MECHATRONICS CORPORATION, Yokohama (JP)

( * ) Notice: Subject to any disclaimer, the term of this patent is extended or adjusted under 35 U.S.C. 154(b) by 0 days.

(21) Appl. No.: 17/174,592

(22) Filed: Feb. 12, 2021

(65) Prior Publication Data

US 2021/0254212 A1   Aug. 19, 2021

(30) Foreign Application Priority Data

Feb. 14, 2020   (JP) .................................. 2020-023678
Jan. 13, 2021   (JP) .................................. 2021-003771

(51) Int. Cl.
   *C23C 14/56*   (2006.01)
   *C23C 16/44*   (2006.01)
   (Continued)

(52) U.S. Cl.
   CPC ........ *C23C 16/4584* (2013.01); *C23C 14/564* (2013.01); *C23C 16/4401* (2013.01);
   (Continued)

(58) Field of Classification Search
   CPC .............. C23C 16/4584; C23C 14/564; C23C 16/4401; C23C 16/4411; C23C 16/4586;
   (Continued)

(56) References Cited

U.S. PATENT DOCUMENTS

| 5,538,603 A * | 7/1996 | Guo ...................... H01J 37/34 |
| | | 204/298.18 |
| 2001/0008207 A1* | 7/2001 | Ando .................... C23C 14/081 |
| | | 204/192.27 |

(Continued)

FOREIGN PATENT DOCUMENTS

| CN | 106978582 A | 7/2017 |
| CN | 110295350 A | 10/2019 |

(Continued)

*Primary Examiner* — Nicholas A Smith
*Assistant Examiner* — Patrick S Ott
(74) *Attorney, Agent, or Firm* — Oblon, McClelland, Maier & Neustadt, L.L.P.

(57) ABSTRACT

According to one embodiment, a film formation apparatus and a moisture removing method thereof that can facilitate the removal of moisture in the chamber without the complication of the apparatus are provided. The film formation apparatus according to the present embodiment includes the chamber 10 which an interior thereof can be made vacuum, the exhauster 20 that exhausts the interior of the chamber 10, the carrier 30 that circularly carries the workpiece W by a rotation table 31 provided inside the chamber 10, and the plurality of the plasma processor 40 that performs plasma processing on the workpiece W which is circularly carried, in which the plurality of the plasma processor 40 each has the processing spaces 41 and 42 to perform the plasma processing, at least one of the plurality of the plasma processor 40 is the film formation processor 410 that performs film formation processing by sputtering on the workpiece W which is circularly carried, and at least one of the plurality of the plasma processor 40 is the heater 420 that removes moisture in the chamber 10 by producing plasma and heating the interior of the chamber 10 via the rotation table 31 together with exhaustion by the exhauster 20 and rotation by the rotation table 31 in a condition the (Continued)

film formation process by the film formation processor 410 is not performed.

13 Claims, 6 Drawing Sheets

(51) Int. Cl.
  *C23C 16/458* (2006.01)
  *H01J 37/34* (2006.01)
  *C23C 16/455* (2006.01)

(52) U.S. Cl.
  CPC ...... *C23C 16/4411* (2013.01); *C23C 16/4586* (2013.01); *C23C 16/45551* (2013.01); *H01J 37/3488* (2013.01)

(58) Field of Classification Search
  CPC .......... C23C 16/45551; C23C 14/3464; C23C 14/505; C23C 14/541; C23C 14/544; C23C 14/34; C23C 14/568; H01J 37/3488
  See application file for complete search history.

(56) References Cited

U.S. PATENT DOCUMENTS

| | | | | |
|---|---|---|---|---|
| 2003/0066606 A1* | 4/2003 | Clarke | ............... | H01L 21/67115 156/345.31 |
| 2003/0147075 A1* | 8/2003 | Otsuki | ................ | C23C 16/4412 356/338 |
| 2004/0245092 A1* | 12/2004 | Reynolds | .............. | C23C 14/352 204/192.12 |
| 2005/0006222 A1* | 1/2005 | Ding | ....................... | C23C 14/35 204/192.12 |
| 2009/0117272 A1* | 5/2009 | Behres | .................. | C23C 14/505 118/730 |
| 2010/0092803 A1* | 4/2010 | Yuasa | ................. | C23C 14/5853 427/535 |
| 2010/0112814 A1 | 5/2010 | Krishnan | | |
| 2010/0227476 A1 | 9/2010 | Peck | | |
| 2013/0295275 A1* | 11/2013 | Yokoyama | ............ | A63F 13/327 118/719 |
| 2014/0024200 A1* | 1/2014 | Kato | ................. | H01L 21/68771 118/723 R |
| 2015/0235822 A1* | 8/2015 | Muto | .................... | C23C 14/564 204/298.11 |
| 2016/0254137 A1 | 9/2016 | Tolle et al. | | |
| 2017/0287677 A1 | 10/2017 | Kato | | |
| 2018/0037983 A1* | 2/2018 | Akiba | ..................... | C23C 14/50 |
| 2018/0172988 A1* | 6/2018 | Ahmed | ................. | G02B 1/002 |
| 2018/0355479 A1* | 12/2018 | Karakawa | ......... | H01L 21/02211 |

FOREIGN PATENT DOCUMENTS

| | | |
|---|---|---|
| JP | 61-73879 A | 4/1986 |
| JP | 2005-352018 A | 12/2005 |
| JP | 2010-225847 A | 10/2010 |
| KR | 10-2017-0113155 A | 10/2017 |
| KR | 10-2019-0111759 A | 10/2019 |
| TW | 200922852 A | 6/2009 |
| TW | 201100582 A1 | 1/2011 |
| TW | 201537638 A | 10/2015 |
| TW | 201638368 A | 11/2016 |
| TW | 201810424 A | 3/2018 |

* cited by examiner

FILM FORMATION APPARATUS AND MOISTURE REMOVAL METHOD THEREOF

CROSS-REFERENCE TO RELATED APPLICATION

This application is based upon and claims the benefit of priority from Japan Patent Application No. 2020-023678, filed on Feb. 14, 2020, and Japan Patent Application No. 2021-003771, filed on Jan. 13, 2021, the entire contents of which are incorporated herein by reference.

FIELD OF INVENTION

The present disclosure relates to a film formation apparatus and a moisture removal device therein.

BACKGROUND

In the manufacturing process of various products such as semiconductor device, liquid crystal display, organic EL display, and optical disc, for example, a thin film such as optical film may be formed on a workpiece such as wafer and glass substrate. The thin film can be produced by film formation process to forma film of metal, etc., on a workpiece, and by membrane process, etc., such as etching, oxidation, or nitriding on the formed film.

The film formation process and the membrane process may be performed by various method, and one of them is a method to perform processing using plasma produced in a chamber which is depressurized to a predetermined degree of vacuum. In the film formation process, an inert gas is introduced into a chamber in which a target formed from a film formation material and DC voltage is applied to the target. Ions of plasma inert gas are bombarded to the target, and the film formation material that is beaten out from the target is deposited on the workpiece, so that the film is formed. Such film formation process is called sputtering. In the membrane process, a processing gas is introduced into a vacuum chamber in which an electrode is placed, and high frequency voltage is applied to the electrode. Active species such as ion and radical of the plasma processing gas are bombarded on the film on the workpiece, so that the membrane process is performed.

To continuously perform such film formation process and membrane process, there is a plasma processing apparatus in which a rotation table that is a rotating body is attached to the interior of one chamber and a plurality of film formation units and a plurality of membrane processing units are arranged in the circumferential direction above the rotation table are provided. The film formation units and the membrane processing units each have a processing room (film formation room and membrane processing room) divided from one another. Bottoms of the processing rooms which face the rotation table are opened. The rotation table holds and carries the workpiece and makes the workpiece to pass through right below the plurality of the processing rooms, to perform the thin film such as the optical film.

At various positions in the chamber of the film formation apparatus as described above, the film formation material scattered from the film formation unit are deposited. When the deposited film formation material is peeled off, the workpiece that is a film formation target is contaminated. However, if the film is directly attached to an inner wall of the chamber or the rotation table, it would be extremely difficult to remove it. Therefore, a defensive board is detachably provided to cover the inner wall of the chamber and the surface of the rotation table, etc. The defensive plate prevents the film formation material scattered at the time of film formation process from attaching to the inner wall of the chamber and the surface of the rotation table due to the film formation material attaching to its own.

Such defensive plate needs to be removed and washed (perform maintenance) after continuously performing film formation to prevent the film attached thereto from peeling off and contaminating the workpiece. For, example, the chamber is released in the atmosphere, the defensive board detached from the chamber, then the film deposited on the surface of the defensive board is removed by sandblasting, and the defensive board is further washed with pure water. After washing, the defensive board is dried and is carried to the film formation apparatus in vacuum pack, the vacuum pack is opened, and the defensive plate is attached to the film formation apparatus again to perform film formation.

Here, when performing the film formation by the sputtering, the chamber of the film formation apparatus is depressurized to high vacuum level. By this, impurities present in the chamber is reduced, and the gas molecules is reduced such that it will have large mean free path. As a result, the film formation material beaten out from the target can easily reach the workpiece, and the quality of the film will be stable and dense. However, right after the replacement of the defensive plate, a condition in which degree of vacuum in the chamber does not rise continues for a long time even when the film formation apparatus is operated to exhaust and depressurize the chamber. This is because moisture is remaining inside the defensive plate at the time when the defensive plate is attached after washing and drying, and a large amount of moisture is produced from the defensive plate as the chamber is depressurized.

Furthermore, when the interior of the chamber is released to the atmosphere, for example, at the time of maintenance, moisture included in the atmosphere is adsorbed in the wall and various components in the chamber. Therefore, moisture must be removed not only from the defensive plate, but from all components in the chamber released to the atmosphere.

Since moisture is gradually evaporated and exhausted as the chamber is depressurized, such a condition is improved as the film formation continues. However, since the numbers and areas of the components including the defensive plate coupled in the chamber which contain moisture are very large, amount of moisture produced is large. Therefore, it is hard to completely remove moisture and get the degree of vacuum required for processing in a short time. For example, several days to several weeks may be required for the condition preferable for the film formation. Accordingly, after the interior of the chamber is released to the atmosphere and is maintained or after the defensive plate is replaced, a term in which the film formation cannot be performed continues for a long time, resulting in the reduction of productivity. In addition, when the film formation is performed in a condition moisture is remaining, there is a consideration that adverse effect to the film formation, such as roughness and failure in a surface of the film formed may occur.

To solve this, a method of providing a heating apparatus in the chamber, such as an infrared lamp, (JP2005-352018A (published unexamined patent application)), and a method of introducing heated gas and heating the components in the chamber to facilitate the evaporation of moisture (JP2010-225847A (published unexamined patent application)) are suggested. However, in a batch-type film formation apparatus which performs processing across a plurality of processing rooms while rotating and carrying the workpiece, providing the heating apparatus or introducing heated inert gas for each processing room causes complication of the apparatus structure and large cost.

The defensive plate may be dehumidified (evaporate moisture) by putting it in a heating furnace before coupling it in the chamber. However, since each one defensive plate is large and the number thereof is many, the heat furnace that can house all defensive plates to dehumidification is not realistic. Furthermore, even if the defensive plates are dehumidified beforehand, since they are exposed in the atmosphere when coupled in the chamber, they adsorb moisture again.

The present disclosure is suggested to address the above problems, and the objective is to provide a film formation apparatus and a moisture removing method thereof that can facilitate the removal of moisture in the chamber without the complication of the apparatus.

SUMMARY OF THE INVENTION

To achieve the above objective, a film formation apparatus of present embodiments includes:
  a chamber which an interior thereof can be made vacuum;
  an exhauster that exhausts the interior of the chamber;
  a carrier that circularly carries a workpiece by a rotation table provided inside the chamber; and
  a plurality of plasma processor that performs plasma processing on the workpiece which is circularly carried,
  in which:
  the plurality of the plasma processor each has a processing space to perform the plasma processing,
  at least one of the plurality of the plasma processor is a film formation processor that performs film formation processing by sputtering on the workpiece which is circularly carried, and
  at least one of the plurality of the plasma processor is a heater that removes moisture in the chamber by producing plasma and heating the interior of the chamber via the rotation table together with exhaustion by the exhauster and rotation by the rotation table in a condition the film formation process by the film formation processor is not performed.

Furthermore, a moisture removing method of the film formation apparatus of the present disclosure includes:
  an exhaustion starting process of starting exhaustion of a chamber by an exhauster;
  a rotation starting process of starting rotation of a rotation table;
  a processing gas introducing process of introducing processing gas to a processing space by a processing gas introducer;
  a plasma production process of producing plasma of the processing gas in the processing space by a plasma producer;
  a processing gas stopping process of stopping introduction of the processing gas by the plasma introducer;
  a producing plasma stopping process of stopping the producing plasma of the processing gas in the processing space by the plasma producer; and
  a rotation stopping process of stopping rotation of the rotation table.

According to the present disclosure, the film formation apparatus and the moisture removing method thereof that can facilitate the removement of moisture in the chamber without the complication of the apparatus can be provided.

DESCRIPTION OF PREFERRED EMBODIMENT

An embodiment of a film formation apparatus according to the present disclosure is described in detail by referring to figures.

[Outline]

Figure 1:
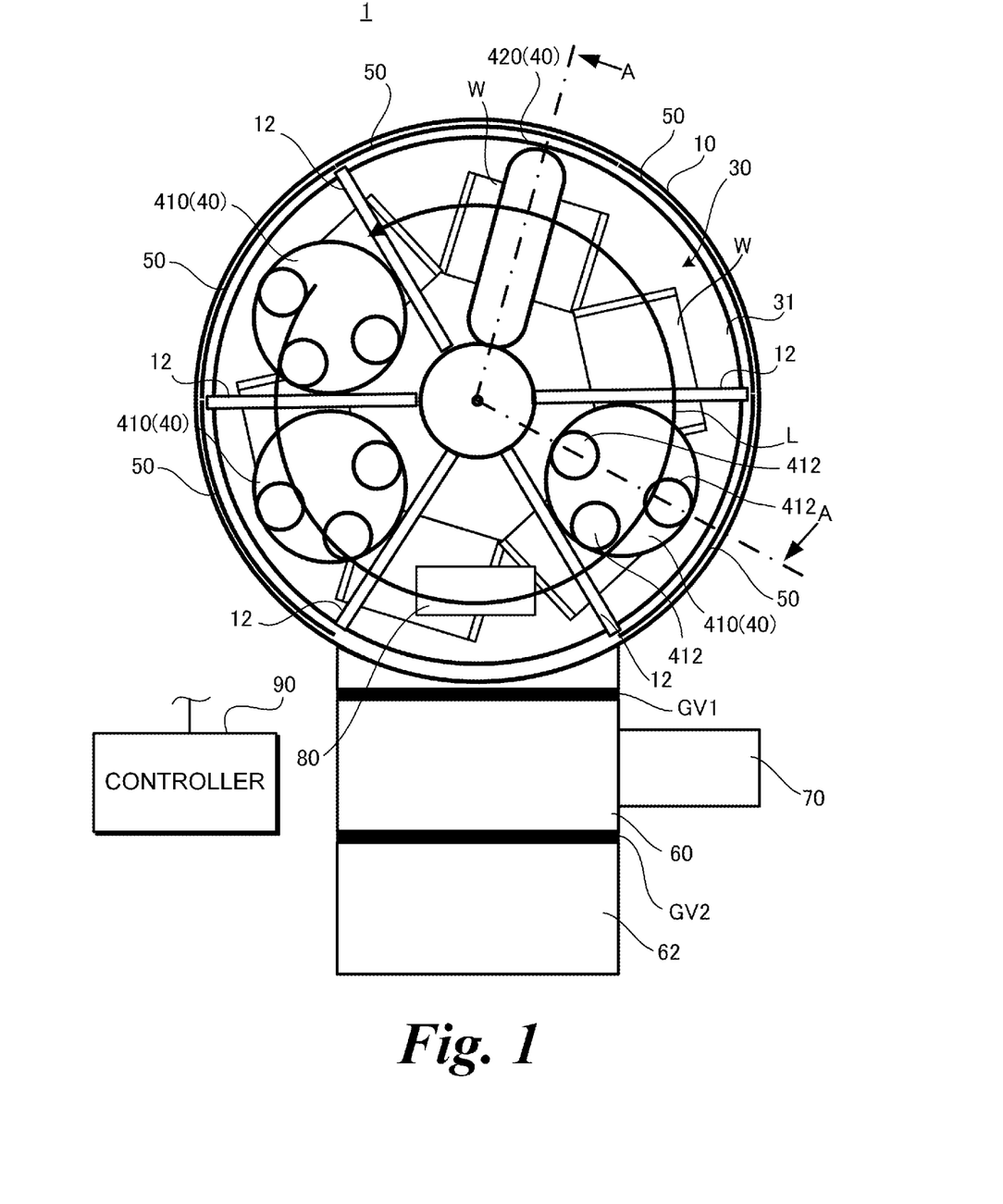
FIG. 1 is a perspective plan view schematically illustrating a configuration of a film formation apparatus according to an embodiment.
Figure 2:
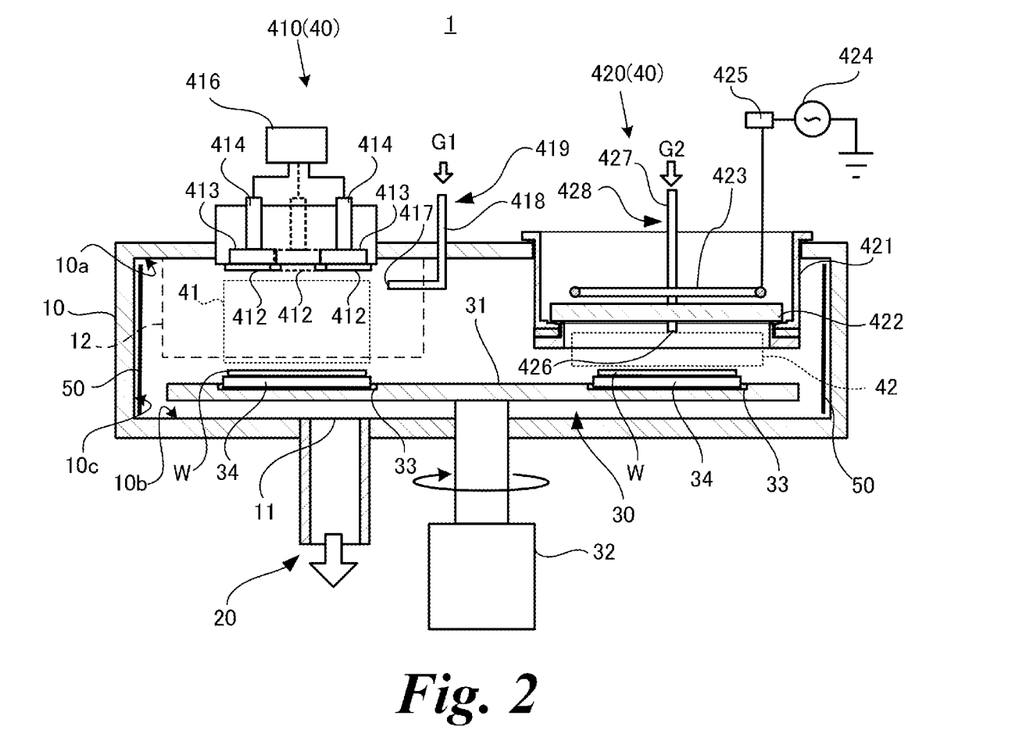
FIG. 2 is a cross-sectional view along A-A in FIG. 1 and is a detailed view of an inner configuration viewed from a side surface of the film formation apparatus in the embodiment of FIG. 1.

As illustrated in the perspective view in FIG. 1 and the cross-sectional view in FIG. 2, a film formation apparatus 1 is an apparatus to perform film formation on a workpiece W by sputtering. The workpiece W is a target to which the film formation is performed, that is, an object to be processed. For example, glass substrate and wafer, etc., are used as the workpiece W. However, the workpiece W may have any shape and material as long as it can be the film formation target by plasma processing. This film formation apparatus has a chamber 10, an exhauster 20, a carrier 30, a plasma processor 40, a defensive plate 50, a transfer chamber 60, a refrigerator 70, a gas analyzer 80, and a controller 90.

The chamber 10 is a container which an interior thereof can be made vacuum. The exhauster 20 exhausts the interior of the chamber 10. The carrier 30 circularly carries the workpiece W by a rotation table 31 provided inside the chamber 10. The plasma processor 40 is provided inside the chamber 10 and performs plasma processing on the workpiece W which is circularly carried. The plasma processing includes various types of process performed on processing targets by utilizing plasma gas.

A plurality of the plasma processors 40 is provided. The plurality of the plasma processors 40 each has a processing space 41 to perform the plasma processing. Three of the plurality of the plasma processors 40 are film formation processors 410 that performs the film formation processing by sputtering on the workpiece W which is circularly carried. One of the plurality of the plasma processors 40 is a heater 420 which removes moisture in the chamber 10 by producing plasma and heating the interior of the chamber 10 via the rotation table 31 together with exhaustion by the exhauster 20 and rotation by the rotation table 31 in a condition the film formation process by the film formation processor 410 is not performed.

The defensive plate 50 is detachably provided inside the chamber 10 and prevents film formation materials scattered from the film formation processor 410 to stick inside the chamber 10. The transfer chamber 60 is a container to carry the workpiece W into and out from the chamber 10 via a gate valve GV1. The refrigerator 70 is a device which cools gas (gaseous body) desorbed from the chamber 10 to remove moisture in the desorbed gas. The refrigerator 70 of the present embodiment is provided in the transfer chamber 60.

The gas analyzer 80 is a device which measures component amount of the gas exhausted from the chamber 10. The controller 90 controls the film formation processor 410 and the heater 420 based on the component amount of the gas measured by the gas analyzer 80.

[Configuration]
[Chamber]

As illustrated in FIG. 1, the chamber 10 is a container in a cylindrical shape, in which the interior is divided and separated into a plurality of arc-shape section by a dividing portion 12. The film formation processor 410 is arranged in three of the sections and the heater 420 is arranged in other one of the sections. Furthermore, the transfer chamber is connected to further one of the sections.

As illustrated in FIG. 2, the chamber 10 is surrounded and formed by a ceiling 10a in a disc-shape, a bottom 10b in a disc-shape, and an inner circumferential surface 10c in a ring-shape. The dividing portion 12 is a rectangle wall plate arranged radially from the center of the cylindrical shape, extends from the ceiling 10a toward the bottom 10b, and does not reach the bottom 10b. That is, a cylindrical space is ensured at the bottom 10b-side.

The ceiling 10a is detachably provided to the chamber 10. By detaching the ceiling 10a, the maintenance such as cleaning of the interior of the chamber 10 and detachment of the defensive plate 50 is enabled. The ceiling 10a is attached to via a sealing component such as an unillustrated O-ring, so that the chamber 10 is sealed.

Figure 5:
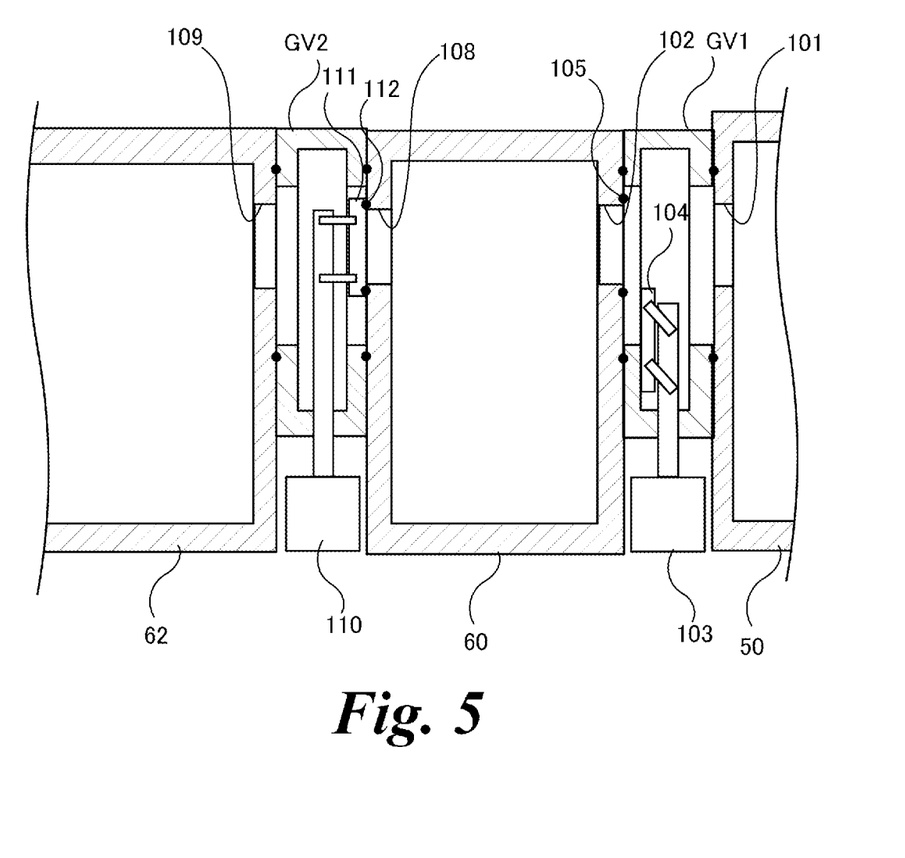
FIG. 5 is a cross-sectional view schematically illustrating a configuration of a part of the film formation apparatus according to an embodiment.

As illustrated in FIG. 5, which is a cross sectional view, a carry-in-out port 101 to carry the workpiece W in and out may be provided to a side wall of the chamber 10. The carry-in-out port 101 faces a carry-in-out port 102 provided to a side wall of the of the transfer chamber 60. The carry-in-out port 102 may be opened and closed by the gate valve GV1. A gate open-close mechanism 103, a door 104, and a sealing component 105 such as an O-ring may be provided to the gate valve GV1. The door 104 moves up and down, and opens and closes by the gate open-close mechanism 103. When the door 104 is closed by the gate open-close mechanism 103, the sealing component 105 is pressed to the side surface of the carry-in-out port 102, so that the carry-in-out port 102 is airtightly closed.

Now returning to FIG. 1, the dividing portion 12 divides the processing spaces 41 and 42 in which plasma processing is performed. That is, the film formation processor 410 and the heater 420 are each smaller than the chamber 10 and have the processing spaces 41 and 42 which are separated from each other. By dividing the processing spaces 41 and 42 by the dividing portion 12, the dispersion of the gas and the film formation material from the film formation processor 410 and the heater 420 is suppressed. As illustrated in FIG. 2, a gap which the workpiece W on the rotating rotation table 31 can pass through is formed between a lower end of the dividing portion 12 and the rotation table 31 described below. That is, the height of the dividing portion is set so that a slight gap is formed between a lower edge of the dividing portion 12 and the workpiece W.

[Exhauster]

The exhauster 20 has a negative pressure circuit including a piping, and an unillustrated pump and valve, etc. The exhauster 20 is connected to an exhaust port 11 provided to the chamber 10. The exhauster 20 depressurizes and makes the interior of the chamber 10 vacuum by the exhaustion via the exhaust port 11.

[Carrier]

The carrier 30 has the rotation table 31, a motor 32, and a holder 33, and circularly carries the workpiece W along a carrying path L which is a trajectory of circumference (refer FIG. 1). A placement surface of the rotation table 31 for the workpiece W is arranged so that there is the gap which the workpiece W can pass through between the lower end of the dividing portion 12 and the rotation table 31. The rotation table 31 has a disc-shape and is broadly expanded in the chamber to the level it does not contact the inner circumferential surface 10c. The rotation table 13 has a continuous surface so as to cover each processing space 41 in the chamber in a plan view.

The rotation table 31 is made of metal and, for example, may be made of stainless steel. The surface of the rotation table 31 is processed by plasma resistant surface processing to prevent wearing by plasma.

The motor 32 continuously rotates the rotation table 31 in a predetermined rotation speed with a center of the rotation table 31 being a rotation axis. The holders 33 are grooves, holes, protrusions, jigs, or holders, etc., which are arranged at circumferential distribution position on the surface of the rotation table 31, and holds a tray 34 on which the workpiece W is present by a mechanical chuck or an adhesive chuck, etc. The tray 34 is a component to carry the workpiece W thereon. For example, the workpiece W are aligned and arranged in a matrix on the trays 34. In the present embodiment, six holders 33 are arranged on the rotation table 31 at the interval of 60 degrees. However, the numbers of the workpieces W and trays 34 carried together are not limited.

[Film Formation Processor]

The film formation processor 410 produces plasma and exposes the target 312 formed by the film formation material to said plasma. By this, the film formation processor 410 bombards ions included in the plasma to the film formation material and deposits particles which was beaten out on the workpiece W to perform film formation. As illustrated in FIG. 2, this film formation processor 410 includes the target 412, a sputtering source formed by a backing plate 413 and an electrode 414, and a plasma generator formed by a power supply 416 and a sputtering gas introducer 419.

The target 412 is a plate-shape component formed by the film formation material that will deposited on the workpiece W to be a film. The target 412 is provided away from the carrying path L of the workpiece W placed on the rotation table 31. A surface of the target 412 is held at the ceiling 10a of the chamber 10 so as to face the workpiece W placed on the rotation table 31. Three targets 412 are provided at positions lining up on vertexes of a triangle in a planer view.

The backing plate 413 is a supporting component that holds the target 412. This backing plate 413 individually holds each target 412. The electrode 414 is a conductive component to individually apply electric power to each target 412 from the exterior of the chamber 10, and is electrically connected to the target 412. The electric power applied to each target 412 can be changed individually. In addition, magnet and cooling mechanism, etc., are included in the sputtering source as appropriate if necessary.

The power supply 416 is, for example, a DC power source that applies high voltage and is electrically connected to the electrode 414. The power supply 416 applies electric power to the target 412 via the electrode 414. The rotation table 31 is at potential equivalent to the grounded chamber 10, and by applying high voltage on the target 412-side, potential difference is produced. Note that the power supply 416 may be RF power supply to perform high frequency sputtering.

As illustrated in FIG. 2, the sputtering gas introducer 419 introduces a sputtering gas G1 into the chamber 10. The sputtering gas introducer 419 has a supply source of the sputtering gas G1 such as an unillustrated cylinder, a piping 418, and a gas introducing port 417. The piping 418 is connected to the supply source of the sputtering gas G1, airtightly penetrates the chamber 10, extends inside the chamber 10, and the end thereof is opened as the gas introducing port 417.

The gas introducing port 417 opens between the rotation table 31 and the target 412, and introduces the sputtering gas G1 for the film formation into the processing space 41 formed between the rotation table 31 and the target 412. Noble gas may be employed as the sputtering gas G1, and argon (Ar) gas, etc., is preferable.

In such a film formation processor 410, the sputtering gas introducer 419 introduces the sputtering gas G1, and the power supply 416 applies high voltage to the target 412 via the electrode 414. Accordingly, the sputtering gas G1 introduced in the processing space 41 becomes plasma, and active species such as ions, etc., are produced. The ions in plasma bombard the target 412 and beat out the particles of the film formation material.

The workpiece W which is circularly rotated by the rotation table 31 passes through this processing space 41. When the workpiece W passes through the processing space 41, the particles of the film formation material which was beaten out are deposited on the workpiece W, and the film by the particles is formed on the workpiece W. The workpiece W is circularly rotated by the rotation table 31 and repeatedly passes through the processing space, so that the film formation process is performed.

[Heater]

The heater 420 heats the interior of the chamber 10 by producing inductively coupled plasma in the processing space 42 to which the processing gas G2 was introduced. Furthermore, the heater 420 of the present embodiment acts as the film processor to perform film processing relative to the film produced on the workpiece W by the film formation processor 410. The film processing is a process to change properties of the film deposited by the film formation process and includes oxidation, nitriding, etching, and ashing, etc. For example, if oxidation is performed, produce plasma of a oxygen gas and produce chemical species. Oxygen atoms included in the produced chemical species bombards the film on the workpiece W and forms an oxidized film that is a compound film.

As illustrated in FIG. 2, the heater 420 has the plasma producer configured by a cylindrical body 421, a window 422, an antenna 423, a RF power supply 424, a matching box 415, and a processing gas introducer 428.

The cylindrical body 421 is a component to cover the surrounding of the processing space 42. As illustrated in FIGS. 1 and 2, the cylindrical body 421 is a cylinder in which the horizontal cross section is in a rectangular shape with a round corner and has an opening. The cylindrical body 421 is fit in the ceiling 10a of the chamber 10 and protrudes toward the inner space of the chamber 10 so that the opening thereof provided away from and faces the rotation table 31. The cylindrical body 421 is made of metal similarly with the rotation table 31, and a plasma resistant process to prevent the film formation material from attaching is performed on the surface of the cylindrical body 421 by yttria thermal spraying, etc.

The window 422 is a dielectric flat plate in a shape substantially similar to the horizontal cross section of the cylinder 421, such as quartz. This window is provided so as to block the opening of the cylindrical body 421 and divides the processing space 42 to which the processing gas in the chamber is introduced and the interior of the cylindrical body 421. Note that the window 422 may be a dielectric such as alumina or may be a semiconductor such as silicon.

The processing space 42 is formed between the rotation table 31 and the interior of the cylindrical body 421 in the heater 420. The upper surface of the rotation table 31 repeatedly passes through this processing space 42, so that the temperature of the rotation table 31 rises by radiation from plasma that is a heat source, and the heat is transmitted to the surrounding. That is, the interior of the chamber 10 is heated via the rotation table by the heat of plasma. In addition, when performing the film processing at the heater 420, the workpiece W which is circularly carried repeatedly passes through the processing space 42 by the rotation table 31 to perform film processing.

The antenna 423 is a dielectric which is wound around in a coil-shape, is arranged in the inner space of the cylindrical body 421 separated from the processing space 42 in the chamber 10 by the window 422, and produces electric field when current flows. It is preferable that the antenna 423 is arranged near the window 422 so that the electric field produced from the antenna 423 is effectively introduced to the processing space 42 via the window 422. The antenna 423 is connected to the RF power supply 424 which applies high frequency voltage. The matching box 425 that is a matching circuit is connected to an output side of the RF power supply 424. The matching box 425 stabilizes the discharge of plasma by matching the impedance of the input side and the output side.

As illustrated in FIG. 2, the processing gas introducer 428 introduces the processing gas G2 into the processing space 42. The processing gas introducer 428 has a supply source of the processing gas G2 such as an unillustrated cylinder, a piping 427, and a gas introducing port 426. The piping 427 is connected to the supply source of the processing gas G2, airtightly penetrates the chamber 10, extends inside the chamber 10, and the end thereof is opened as the gas introducing port 426.

The gas introducing port 426 opens in the processing space 42 between the window 422 and the rotation table 31 and the processing gas G2. Noble gas may be employed as the processing gas G2, and argon (Ar) gas, etc., is preferable. Furthermore, in the processing gas G2 of the present embodiment, oxygen (O 2) gas is added in addition to argon gas.

In such heater 420, high frequency voltage is applied to the antenna 423 from the RF power supply 424. By this, high frequency current flows in the antenna 423, and electric field by electromagnetic induction is produced. The electric field is produced via the window 422, the processing gas G2 becomes plasma, and the inductively coupled plasma is produced. By this plasma, the surface of the rotation table 31 passing through the processing space 42 is heated.

Furthermore, when performing film processing by the heater 420, oxygen chemical species including oxygen ions is produced, bombards the film on the workpiece W, and is bonded with atoms of the film material. AS a result, the film on the workpiece W becomes the oxidized film. The workpiece W orbits along the circumferential direction in the chamber 10 for a number of times, alternately rounds and passes through three film formation processor 410 and the heater 420, so that the film formation and the film processing on the workpiece W are alternately repeated and the film grows to the desired thickness. Therefore, the film formation apparatus 1 of the present embodiment is configured as the batch-type apparatus that can form the film on all of the plurality of the workpieces W held by the plurality of holder 33 together.

[Defensive Plate]

The defensive plate 50 is, for example, a metal plate. On a surface of the defensive plate 50, for example, a plasma thermal spray film of aluminum or aluminum alloy is formed, and the surface is roughed by sandblasting, etc. By this, adhesion of the surface and the sticked and deposited film is improved, and peeling off of the film material is suppressed.

A plurality of the defensive plates 50 is combined, so that the defensive plate 50 is, for example, arranged to cover the inner circumferential surface 10c of the chamber 10. Furthermore, although not illustrated, the defensive plate is also arranged on the rotation table 31 other than where the tray 34 is present. The tray 34 also acts as the defensive plate 50 to prevent the attachment sticking of the film formation material to the rotation table 31. The defensive plate 50 is also arranged to the side surface of the dividing portion 12. In addition, the defensive plate 50 is also provided to the surroundings of the target 412 of the processing space 41 of the film formation processor 410. In this way, the defensive plate 50 is arranged in positions where the film forming material may stick to, as appropriate.

[Transfer Chamber]

Figure 4:
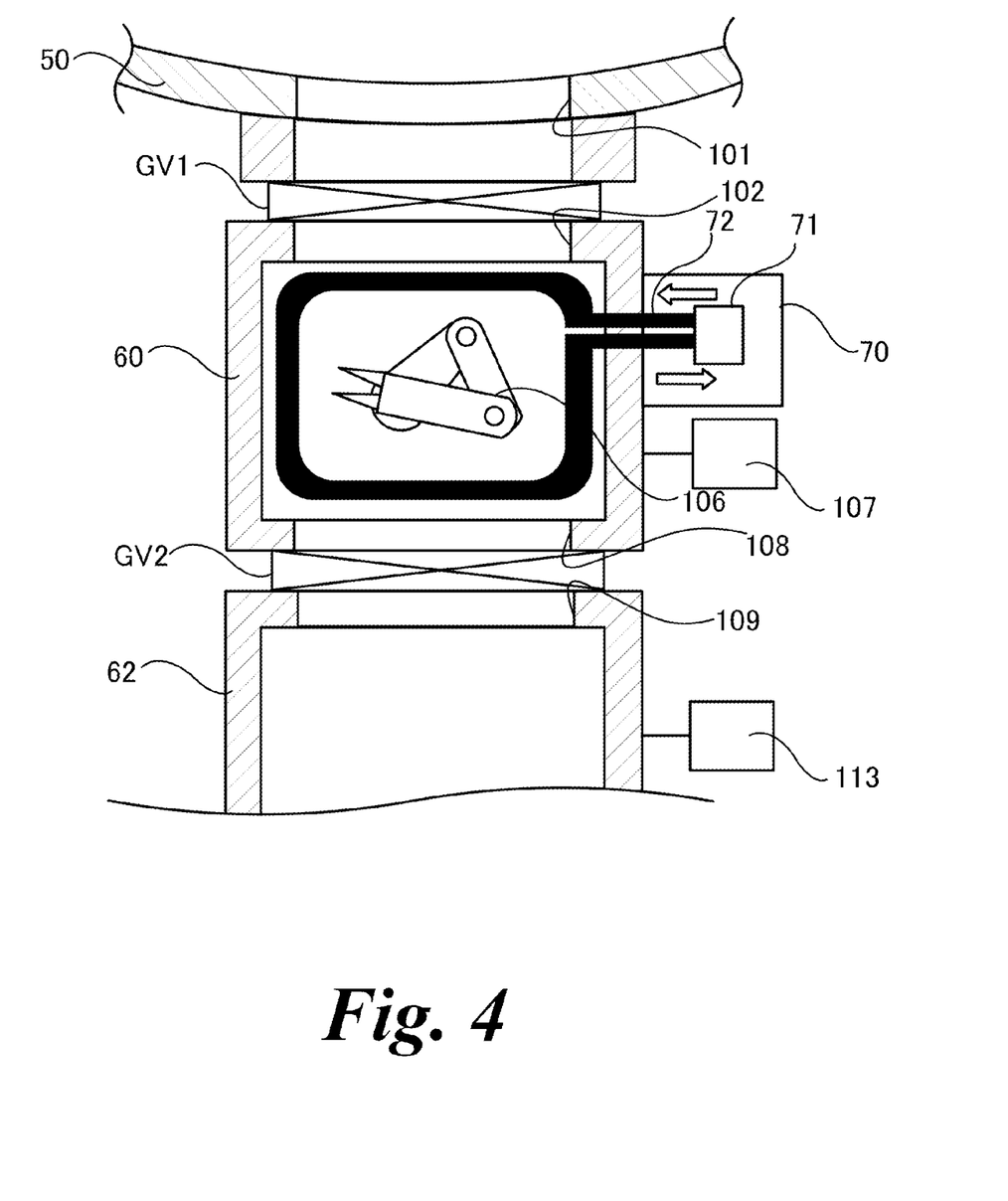
FIG. 4 is a cross-sectional view schematically illustrating a configuration of a part of the film formation apparatus according to an embodiment.

As illustrated in FIGS. 1 and 4, the transfer chamber 60 is a path which has an inner space in which workpiece W before being carried into the chamber 10 is housed. The transfer chamber 60 is connected to the chamber 10 via the gate valve GV1. In the inner space of the transfer chamber 60, a carrying device 106 to carry the workpiece W in and out is provided. The transfer chamber 60 is depressurized by exhaustion by a vacuum pump 107, and carries the tray 34 loading the unprocessed workpiece W into the chamber 10 and carries the tray 34 loading the processed workpiece W out from the chamber 10 by the carrying device 106 while maintaining the vacuum condition of the chamber 10.

As illustrated in FIG. 5, a carry-in-out port 108 to carry the workpiece Win and out may be provided to a side wall of the transfer chamber 60 opposite to the side wall at which the carry-in-out port 102 is provided. The carry-in-out port 108 faces a carry-in-out port 109 provided to a side wall of the transfer chamber 60 of a load lock unit 62. The carry-in-out port 108 may be opened and closed by the gate valve GV2. A gate open-close mechanism 110, a door 111, and a sealing component 112 such as an O-ring may be provided to the gate valve GV2. The door 111 moves up and down, and opens and closes by the gate open-close mechanism 110. When the door 111 is closed by the gate open-close mechanism 110, the sealing component 112 is pressed to the side surface of the carry-in-out port 108, so that the carry-in-out port 108 is airtightly closed.

As illustrated in FIG. 4, the load lock unit 62 is connected to the transfer chamber 60 via the gate valve GV2. The load lock unit 62 is device to carry the tray 34 loading the unprocessed workpiece W into the chamber 10 from outside and carries the tray 34 loading the processed workpiece W out from the chamber 10 by the carrying device 106 while maintaining the vacuum condition of the chamber 10. Note that the load lock unit 62 is depressurized by exhaustion by a vacuum pump 113.

[Refrigerator]

As illustrated in FIGS. 1 and 4, the refrigerator 70 is connected to the transfer chamber 60. The refrigerator 70 has a freezer 71 and a cooling coil 72, and is a device to condense and trap moisture in the transfer chamber 60 at the cooling coil 72 cooled by the freezer 71 while the exhaustion by the above vacuum pump 107. Since moisture is trapped as frost, defrosting operation to remove the frost from the coil is performed at maintenance to release the transfer chamber 60 in the atmosphere.

The cooling coil 72 is configured of a metal piping such as copper, and liquid or gaseous refrigerant flow therein. For example, the refrigerant may be gas such as Freon-based mixture gas. The refrigerant is cooled to the very low temperature below freezing-point (about $-150°$ C. to $1°$ C.) and flows in the cooling coil 72. The cooling coil 72 is arranged and fixed inside the transfer chamber along the wall surface of the transfer chamber 60. Since The cooling coil 72 is arranged inside the transfer chamber along the wall surface of the transfer chamber 60, the surface area of positions cooled can be increased, so that the cooling efficiency is improved and the trapping probability of moisture by the cooling coil 72 can be increased.

Both end of the cooling coil 72 penetrates the wall surface of the transfer chamber 60 and is communicated with the outer freezer 71. The freezer 71 includes a compressor etc., can make the cooled refrigerant flow in the cooling coil 72.

[Gas Analyzer]

The gas analyzer 80 is a device to measure the component amount of the gas in the chamber 10. For example, the gas analyzer 80 is a mass spectrometer to measure mass of molecules and ions in the gas in the chamber 10, and a quadrupole mass spectrometer may be used. As illustrated in FIG. 1, the gas analyzer 80 is provided at a section of the chamber 10 connected to the transfer chamber 60. The gas analyzer 80 may include a calculator which converts the measured mass into a partial pressure of each component in the chamber 10 and a display which displays the converted partial pressure of each component in time series, in addition to the mass spectrometer.

Among components in gas, it is preferable to remove water ($H_2O$), and hydrogen ($H_2$) and hydroxyl group (—OH) related to water because they affect the film formation and the degree of vacuum. These components may be referred to as moisture related component in below.

[Controller]

The controller 90 controls various components configuring the film forming apparatus 1, such as the exhauster 20, the sputtering gas introducer 419, the processing gas introducer 428, the power supply 416, the RF power supply 424, the carrier 30, the gate valve GV1, the transfer chamber 60, the gate valve GV2, the load lock unit 62, and the refrigerator 70. This controller 90 is a processing device including PLC (Programmable Logic Controller) and CPU (Central Processing Unit) and stores a program which describes control contents, set values, and threshold values.

In detail, the contents to be controlled are an initial exhaustion pressure of the film formation apparatus, a power applied to the target 412 and the antenna 423, a flow amount, introduction time and exhaustion time of the sputtering gas G1 and the processing gas G2, a film formation time, and a rotation speed of the motor 32, etc. By these, the controller 90 can cope with a great variety of film formation specification.

Furthermore, the controller of the present embodiment controls an introduction of the processing gas G2, an application of power to the antenna 423, an opening and closing of the gate valves GV1 and GV2, a temperature of the cooling coil 72, and an operation of the vacuum pump 107 to remove moisture in the chamber 10. In addition, the controller 90 controls the heater 420 based on the component amount of has measured by the gas analyzer 80. That is, the controller 90 monitors the mass of the moisture related component measured by the gas analyzer 80 or the partial pressure based on the mass, and performs the feedback control to stop the plasma of the heater 420 when it becomes equal to or less than the preset threshold value.

Note that, in the descriptions below, "open the gate valve GV1" means that the controller 90 controls the gate open-close mechanism 103 to move the door 104 in a direction away from the carry in-out port 102 and release the carry in-out port 102 so that the chamber 10 and the transfer chamber 60 becomes the communicated space. Also, "closing the gate valve GV1" means that the controller 90 controls the gate open-close mechanism 103 to move the door 104 in a direction getting close to the carry in-out port 102, press the sealing component 105 thereto, and close the carry in-out port 102 so that the space of the chamber 10 and the transfer chamber 60 is separated.

Moreover, "open the gate valve GV2" means that the controller 90 controls the gate open-close mechanism 103 to move the door 111 in a direction away from the carry in-out port 108 and release the carry in-out port 108 so that the transfer chamber 60 and the load lock unit 62 becomes the communicated space. Also, "closing the gate valve GV2" means that the controller 90 controls the gate open-close mechanism 110 to move the door 111 in a direction getting close to the carry in-out port 108, press the sealing component 112 thereto, and close the carry in-out port 108 so that the space of the transfer chamber 60 and the load lock unit 62 is separated.

[Operation]

Figure 6:
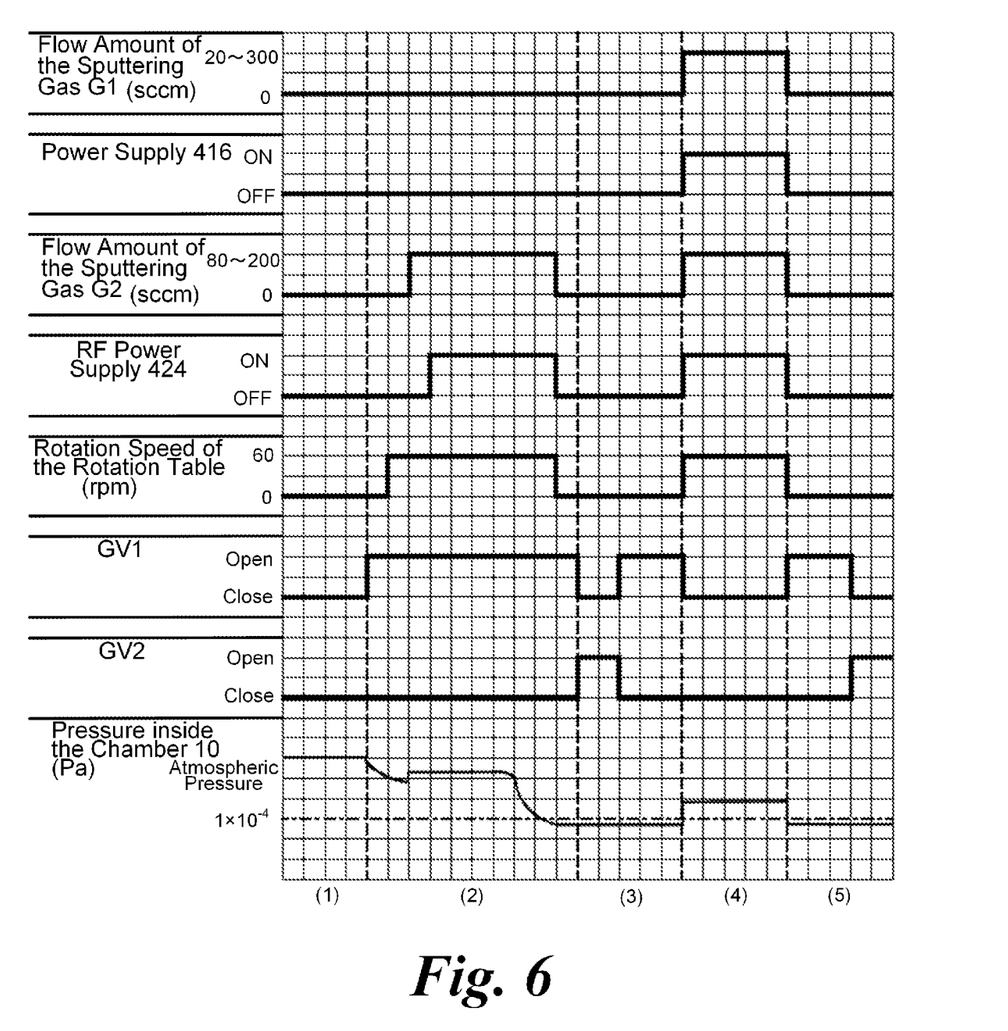
FIG. 6 is a timing chart indicating operations of each component in film formation from a maintenance of film formation apparatus according to an embodiment.

Next, an entire operation of the film formation apparatus 1 controlled by the controller 90 will be described. FIG. 6 is a timing chart indicating operations of each component in a series including a maintenance, a heating process, and a film formation process.

(Maintenance)

In the maintenance indicated in (1) of FIG. 6, the defensive plate 50 is removed from or attached to the chamber 10 so that the chamber 10 is released in the atmosphere and the pressure in the chamber 10 is in atmospheric pressure. In the next heating process, new defensive plate or washed defensive plate 50 are attached in the chamber 10. At this time, the workpiece W is loaded on the rotation table 31. Note that the tray 34 may not be placed in the holder 33 of the rotation table 31.

(Heating Process)

Figure 3:
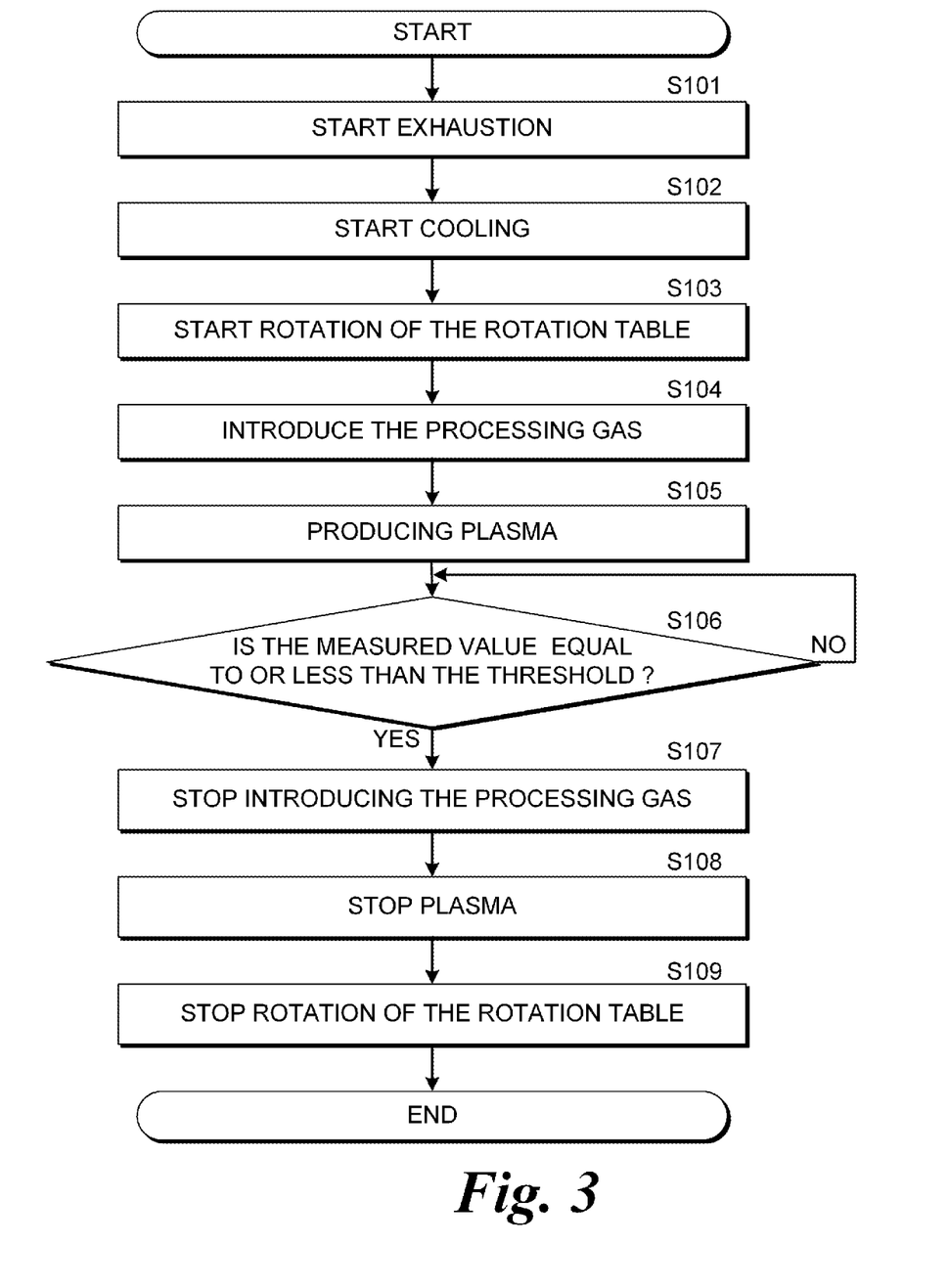
FIG. 3 is a flowchart of a moisture removing process by heating the film formation apparatus according to an embodiment.

Firstly, the operation in the heating process for dehumidification of the defensive plate 50 is described with the reference to the flowchart in FIGS. 3 and (2) in FIG. 6. Note that the method of dehumidification by the heating process by the below scheme is one aspect of the present disclosure. Firstly, The gate valve GV1 between the chamber 10 and the transfer chamber 60 is opened while the gate valve GV2 is closed, and the exhaustion by the exhauster 20 is started (exhaustion starting process: step S101). By this, as illustrated in (2) of FIG. 6, the interior of transfer chamber 60 is depressurized together with the interior of the chamber 10. In addition, the cooling and the exhaustion of the transfer chamber 60 by the refrigerator 70 are also started (cooling starting process: step S102). Moreover, the rotation table 31 starts to rotate (rotation table rotation starting process: step S103). For example, the rotation table 31 rotates in about 60 rpm.

The processing gas introducer 428 starts to introduce argon gas and oxygen gas into the processing space 42 of the heater 420 (processing gas introducing process: step S104). At this time, as illustrated in (2) of FIG. 6, the pressure inside the chamber 10 slightly increases by the introduction of gas. Then, by turning ON the RF power supply of the plasma producer (applying high frequency electric power), the processing gas G2 introduced in the processing space 42 becomes plasma (plasma producing process: step S105). For example, The RF power supply 424 applies high frequency electric power of equal to or more than 9 kW to the antenna 423. By this, the electric field produced by the antenna 423 is produced in the processing space 42 via the window 422. Accordingly, the processing gas G2 supplied to the processing space 42 is excited by this electric field, and the plasma is produced.

By the heat of plasma, the rotation table 31 passing through the processing space 42 is heated by the radiated heat. The rotation table 31 is heated every time it passes through the processing space 42, and furthermore, the heat is diffused to the entire rotation table 31 by heat conduction. Then, since the heated rotation table 31 passes through other spaces in the chamber 10, the interior of the chamber 10 is heated via the rotation table 31, and since the moisture related component is desorbed from the inner wall of the chamber 10 and the defensive plate, etc., the moisture related component in the chamber temporally increases. The heated temperature inside the chamber 10 may be equal to or more than the boiling point according to vapor pressure curve for water in accordance with the pressure inside the chamber 10. In the present embodiment, above heating of the interior of the chamber 10 is started after the exhaustion has started, and since the boiling point of water inside the chamber 10 drops, moisture is evaporated at ab temperature lower than the boiling point of water at atmospheric temperature, facilitating the removement of moisture. To certainly evaporate moisture, for example, the interior of the chamber is preferably heated to equal to or more than 80° C. The heating by the heat of plasma is continued until the measured value of the partial pressure of the moisture related component measured by the gas analyzer 80 is equal to or less than the preset threshold (Step S106, NO).

During this heating process, the gate valve GV1 between the chamber 10 and the transfer chamber 60 is opened. That is, the heating process is performed while the chamber 10 and the transfer chamber 60 are communicated. Since the chamber 10 and the transfer chamber 60 form one communicated space, moisture related component desorbed from the component in the chamber 10 which is undergoing the heating process is trapped by the refrigerator 70 in the transfer chamber 60. Therefore, the measured value of the moisture related component that has once increased decreases as the time elapse. Along with this, as illustrated in (2) of FIG. 6, the interior of the chamber 10 is depressurized. When the measured value of the moisture related component becomes equal to or less than the threshold value (step S106, YES), the processing gas introducer 428 stops the introduction of the processing gas G2 (processing gas stopping process: step S107), and the RF power supply is turned OFF (the application of high frequency electric power is stopped) and the producing plasma is stopped producing plasma stopping process: step S108). Note that after the argon gas and producing plasma is stopped, the introduction of oxygen gas may be stopped. Furthermore, the rotation of the rotation table 31 is stopped (rotation table rotation stopping process: step S109). Then, the gate valve GV1 of the transfer chamber 60 is closed. The exhaustion by the exhauster 20 is continued until the film formation process is started and is continued after the film formation process has started.

(Film Formation Process)

Next, the operation of the film formation to the workpiece W will be described. Note that, before the film formation process, the tray 34 on which the workpiece W is loaded is carried into the transfer chamber 60 from the load lock unit 62 in the state the gate valve GV1 is closed, and the workpiece W and the tray 34 are dehumidified by the refrigerator 70.

Firstly, as illustrated in (3) of FIG. 6, the trays 34 on which the workpieces W are loaded are sequentially carried into the chamber 10 from the transfer chamber 60. The holders 33 each hold the trays 34 carried in by the carrying device 106 to place all the trays 34 on which the workpieces W are loaded on the rotation table 31.

Then, as illustrated in (4) of FIG. 6, when the interior of the chamber 10 is depressurized to predetermined pressure by the exhauster 20, the rotation table 31 on which the workpiece W is loaded rotates to reach the predetermined rotation speed. When the rotation table 31 reaches to the predetermined rotation speed, the film formation on the workpiece W by the film formation processor is started. That is, the sputtering gas introducer 419 supplies the sputtering gas G1 to the processing space 41 via the gas introducing port 417. The power supply 416 applies voltage to the target 412 to make the sputtering gas G1 plasma. The ions produced by the plasma bombards the target 412 and beats out particles. The particles are deposited on the surface of the unprocessed workpiece W when it passes through the film formation processor 410 to form thin film.

In this way, the workpiece W passes through the film formation processor 410 by the rotation of the rotation table 31 and the thin film is formed thereon, and the thin is oxidized when the workpiece W passes through the heater 420. That is, the processing gas introducer 428 supplies the processing gas G2 including oxygen gas to the processing space 42 via the gas introducing port 426. Then, the chemical species of oxygen produced by plasma bombards the thin film on the workpiece W so that the thin film becomes the oxidized film. Note that, as illustrated in (4) of FIG. 6, the pressure inside the chamber 10 slightly increases by the introduction of the sputtering gas G1 and the processing gas G2.

In this way, the workpiece W passes through the processing space 41 of the film formation processor 410 in operation so that the film formation process is performed, and the workpiece W passes through the processing space 42 of the heater 420 in operation so that the oxidation process is performed. Note that "in operation" means the same as the plasma producing operation to produce plasma in the processing spaces 41 and 42 in each processor.

The rotation table 31 keeps rotating until the oxidized film in the predetermined thickness is formed on the workpiece W, that is, until predetermined time that was obtained beforehand by simulation or experiment, etc., elapses. After predetermined time has elapsed, the operation of the film formation processor 410 is firstly stopped, and the operation of the heat 420 is stopped. Then, the rotation of the rotation table 31 is stopped. Afterward, as illustrated in (5) of FIG. 6, the pressure inside the chamber 10 decreases by the stop in the introduction of the sputtering gas G1 and the processing gas G2. Accordingly, the tray 34 on which the workpiece W is loaded is carried out from the chamber 10 to the transfer chamber 60 by opening the gate valve GV1. Furthermore, the gate valve GV1 is closed and the gate valve GV2 is opened to carry out the tray 34 on which the workpiece W is loaded to the outside via the load lock unit 62.

[Effect]

(1) As described above, the film formation apparatus according to the present embodiment includes the chamber 10 which an interior thereof can be made vacuum, the exhauster 20 that exhausts the interior of the chamber 10, the carrier 30 that circularly carries the workpiece W by a rotation table 31 provided inside the chamber 10, and the plurality of the plasma processor 40 that performs plasma processing on the workpiece W which is circularly carried.

The plurality of the plasma processor 40 each has the processing spaces 41 and 42 to perform the plasma processing, at least one of the plurality of the plasma processor 40 is the film formation processor 410 that performs film formation processing by sputtering on the workpiece W which is circularly carried, and at least one of the plurality of the plasma processor 40 is the heater 420 that removes moisture in the chamber 10 by producing plasma and heating the interior of the chamber 10 via the rotation table 31 together with exhaustion by the exhauster 20 and rotation by the rotation table 31 in a condition the film formation process by the film formation processor 410 is not performed.

Furthermore, the moisture removing method of the film formation apparatus of the present disclosure includes the exhaustion starting process of starting exhaustion of the chamber 10 by the exhauster 20, the rotation starting process of starting rotation of the rotation table 31, the processing gas introducing process of introducing the processing gas G2 to the processing space 42 by the processing gas introducer 428, a plasma production process of producing plasma of the processing gas G2 in the processing space 42 by a plasma producer, the processing gas stopping process of stopping introduction of the processing gas G2 by the plasma introducer 428, the producing plasma stopping process of stopping the producing plasma of the processing gas G2 in the processing space 42 by the plasma producer, and the rotation stopping process of stopping rotation of the rotation table 31.

In this way, the removement of moisture inside the chamber 10 can be facilitated by heating the interior of the chamber 10 via the rotation table 31 by the heat of plasma. By this, the degree of vacuum inside the chamber can be in early stage. For example, in the present embodiment, the degree of vacuum of about $5 \times 10^{-5}$ Pa can be achieved in about three hours. In this way, by rapidly achieving the degree of vacuum of high vacuum level that is required for the film formation by sputtering, the film formation with stable and dense quality can be performed with high productivity. For the depressurization only by exhaustion, the achievement of such degree of vacuum took several day, resulting in that the time significantly reduced. Furthermore, since there is no need to provide the heater for every plasma processor 40, the configuration of the apparatus does not become complicated, and the cost thereof is reduced.

The heating can also be performed by producing plasma by the film formation processor 410. However, if the film formation processor 410 is operated, the target 412 wears and the replacement of the target 412 becomes more frequent. Furthermore, the film formation material sticks to the interior of the chamber 10 again. In the present embodiment, since the plasma is produced by the heater 420 other than the film formation processor 410 for heating, the target 412 does not wear and the film formation material does not stick to the interior of the chamber 10. In addition, although the rotation table 31 has a roughness in the level that can trap the film formation material so that the film formation material does not stick to the workpiece W, the rotation table 31 traps moisture when it is released in the atmosphere at the time of maintenance. By rotating the rotation table 31 when heating the processing room 42, the rotation table 31 is evenly heated, and the moisture sticking to the surface of the rotation table 31 can be desorbed.

(2) The film formation apparatus 1 includes the defensive plate 50 which is detachably provided inside the chamber 10 and which prevents film formation materials scattered from the film formation processor 410 to stick inside the chamber 10. Therefore, by washing the defensive plate 50 to which the film formation material sticks, attaching the defensive plate 50 inside the chamber 10, and heating defensive plate 50 as described above, moisture on all defensive plates 50 after being washed can be removed together in early stage. By this, the environment inside the chamber 10 can be maintained in a clean condition without the remaining of the moisture and the film formation material sticking, and the film formation in stable quality can be performed.

(3) The film formation apparatus includes the refrigerator 70 which cools gas exhausted from the chamber 10 to remove moisture in the exhausted gas. In this way, moisture is trapped by the refrigerator 70 and is removed more rapidly.

(4) The transfer chamber 60 to carry the workpiece W in and out the chamber 10 is connected to the chamber 10 via the gate valve GV1, and the refrigerator 70 is provided in the transfer chamber 60. Therefore, since the refrigerator 70 cools and traps moisture in the transfer chamber 60 other than the chamber 10 which is heated, the affect from the heat inside the chamber 10 can be suppressed and the reduction in the cooing capability can be prevented. Furthermore, the transfer chamber is separated from the chamber 10 by closing the gate valve GV1 during the film formation. Therefore, even when the interior of the chamber 10 is heated by plasma of the film formation processor and the film processor again during the film formation process, moisture trapped by the refrigerator 70 of the transfer chamber 60 will not be desorbed and released to the interior of the chamber 10. By this, the increase of the moisture related component inside the chamber 10 during the film formation process can be prevented.

(5) The heater 420 includes the processing gas introducer 428 which introduces the processing gas G2 into the processing space 42, and the plasma producer which produces inductively coupled plasma in the processing space 42 to which the processing gas G2 is introduced.

By this, since the plasma produce at the processing space 42 is the inductively coupled plasma produced by the antenna 423, damages to the rotation table 31, etc., and contamination by produced particles can be prevented. That is, for example, in the case the electrode provided in the chamber 10 and the rotation table 31 acts as one pair of electrodes and plasma is produced by applying high frequency voltage to the electrode that is the anode, a vias voltage is applied to the rotation table 31 acting as a part of the cathode, ions are drawn in, and the surface of the rotation table 31 is sputtered (etched). Therefore, the rotation table 31 is damaged and particles produced by the sputter scatter. In the present embodiment, since the plasma produce at the processing space 42 is the inductively coupled plasma produced by applying high frequency voltage to the antenna 423 and producing electromagnetic inductance, the vias voltage is not applied to the rotation table 31 and the sputter by ions are suppressed, and the damage to the rotation table 31 is suppressed. For example, the etching speed by the inductively coupled plasma is about one tenth when compared to the cylindrical electrode.

(6) The film formation apparatus 1 includes the gas analyzer 80 which measures the component amount of the gas included in the exhaustion from the chamber 10, and a controller which controls the heater 420 based on the component amount of the gas measured by the gas analyzer 80. Therefore, the heating process can be stopped at appropriate timing when the amount of the moisture related component is sufficiently reduced, and the process can go on to the film formation process.

(7) The heater 420 is the film processor which performs film processing relative to the film formed on the workpiece W which is circularly carried by the rotation table 31. Therefore, it is not necessary to provide the heater 420 separately from the film processor, and the configuration of the apparatus can be simplified.

Other Embodiments

Although embodiments and modifications of each component in the present disclosure are described, these embodiments and modifications of each component are only presented as one example and are not intended to limit the scope of invention. Above described new embodiments can be implemented in other various forms, and various omissions, replacements, and modifications can be performed without departing from the abstract of the invention. These embodiments and modifications thereof are included in the invention described in scope of claims, while being included in the scope and abstract of invention.

For example, the transfer chamber 60 may not be provided. That is, the humidification effect can be obtained by exhausting moisture produced inside the chamber 10 by heating by the exhauster 20 of the chamber 10. By this, the configuration of the apparatus can be simpler, and the cost thereof can be reduced. In this case, the refrigerator 70 may not be provided. However, the refrigerator 70 may be provided in the chamber 10. For example, the refrigerator may be provided to the exhauster 20 to make the humidification speed faster.

Although the refrigerator 70 is described as having the freezer and the cooling coil in which the refrigerant flows, the refrigerator 70 is not limited thereto and may be a cooling plate having a peltier device. The refrigerator is arbitrary as long as it can cool moisture to the level at which moisture can freeze and be desorbed.

The gas analyzer 80 may not be provided. That is, the apparatus may be controlled to stop heating when predetermined time obtained beforehand by simulation or experiment, etc., elapses from the start of the heating. In this case, "predetermined time" may be a time for the moisture related component to be removed to the level that does not affect the film formation or a time for the degree of vacuum to reach predetermined value before introducing the sputtering gas G1. Furthermore, an operator may determine from the mass or the partial pressure based on the mass displayed in the display of the gas analyzer 80 and stop the heating, instead of the controller 90 performing the feedback control to stop plasma of the heater 420 based on the component amount of gas measured by the gas analyzer 80.

Furthermore, since the depressurization of the interior of the chamber 10 is performed together with the removement of the moisture related component, when the measured value of the moisture related component is equal to or less than the threshold value, the pressure inside the chamber 10 becomes a pressure of predetermined high vacuum level before the sputtering gas G1 and the processing gas G2 are introduced at the time of film formation process ($1 \times 10^{-4}$ Pa). Therefore, a pressure gauge to measure the pressure inside the chamber 10 may be provided instead of the gas analyzer 80, and the heating may be stopped when the pressure inside the chamber 10 measured by the pressure gauge becomes equal to or less than the threshold value. Otherwise, the pressure gauge may be used together with the gas analyzer 80, and the heating may be stopped when the measure value of the moisture related component and the measured value of the pressure inside the chamber 10 both become equal to or less than the threshold value.

In addition, the moisture related component detected by the gas analyzer may be at least one of water ($H_2O$), hydrogen ($H_2$), and hydroxyl group (—OH).

In the heating process, to suppress damages of the rotation table sputtered by ions present in plasma, a substrate, for example a dummy substrate such as quartz, other than the workpiece W may be loaded. Furthermore, only any one of argon gas, nitrogen gas, and oxygen gas may be used as the processing gas G2. For example, by using only oxygen gas, the sputter may be suppressed compared to when argon gas is used. Moreover, since the processing gas G2 is arbitrary as long as it produces plasma, gas other than the gas described above may be used. In addition, the flow amount of the processing gas G2 may be the same in the heating process and in the film formation process, or may be different.

To stop the plasma producing operation, for example, in the above described embodiments, any one process of the introduction of the processing gas G2 by the processing gas introducer 428 and the voltage application by the RF power supply 424 may be stopped. Furthermore, in the examples, although the cooling starting process and the rotation starting process are performed after the exhaustion starting process, they may be performed at the same time, or their order may be changed. That is, the order of each process in the heating process is not limited to the above description.

A number of the plasma processor 40 and numbers of the film formation processor 410 and the heater 420 included thereto is not limited to the above description. The film formation processor 410 and the heater 420 may be in single or in plural. A plurality of the film formation processor 410 by different types of target materials may be provided, and the configuration of the apparatus may be capable of stacking layers of a number of multiple layers by the different types of materials. A plurality of the heaters 420 which perform different film processing may be provided, and all or a part of them may be used for dehumidification by heating to achieve more rapid dehumidification.

Although the doors provided to the gate valves GV1 and GV2 are one each in the above described embodiments, the doors may be provided to each of the carry in-out port 101 of the chamber 10, the carry in-out ports 102 and 108 of the transfer chamber 60, and the carry in-out port 109 of the load lock unit 62 to face each other. That is, the examples are not limited to the above description as long as there are doors that can open and release each space of the chamber 10, the transfer chamber 60, and the load lock unit 62.

What is claimed is:

1. A film formation apparatus comprising:
   a chamber which an interior thereof can be placed under vacuum;
   an exhauster that exhausts the interior of the chamber;
   a carrier that circularly carries a workpiece by a rotation table provided inside the chamber;
   a plurality of plasma processors provided inside the chamber configured to perform plasma processing on the workpiece which is circularly carried; and
   a controller configured to control the exhauster, carrier and plurality of plasma processors,
   wherein:
   the plurality of the plasma processors each has a processing space divided by a dividing portion to perform the plasma processing,
   at least one of the plurality of the plasma processors is a film formation processor that performs film formation processing by sputtering on the workpiece which is circularly carried, at least one of the plurality of the plasma processors is a heater that performs film processing relative to a film produced on the workpiece by the film formation processor or heats the rotation table by producing inductively coupled plasma in the processing space of the heater,
   wherein the controller is configured to control:
   the heater to produce the inductively coupled plasma in the processing space of the heater to heat the rotation table before performing the film formation processing on the workpiece and to stop production of the plasma based on a moisture level in the processing space of the heater,
   the carrier to rotate the rotation table so as to pass through the processing space of the heater in which the inductively coupled plasma is produced in a state in which the workpiece is not loaded on the rotation table, and
   an exhauster to exhaust the interior of the chamber.

2. The film formation apparatus according to claim 1, further comprising a defensive plate that is detachably provided in the chamber and that prevents film formation materials scattered from the film formation processor from sticking inside the chamber.

3. The film formation apparatus according to claim 1, further comprising a refrigerator that cools gas desorbed from the chamber and removes moisture in the desorbed gas.

4. The film formation apparatus according to claim 3, wherein:
   a transfer chamber which carries the workpiece into and out of the chamber and is connected to the chamber via a gate valve, and
   the refrigerator is provided to the transfer chamber.

5. The film formation apparatus according to claim 4, wherein:
   the refrigerator comprises a cooling coil to make a refrigerant flow, and a freezer, and
   the cooling coil is arranged along a wall surface in the transfer chamber.

6. The film formation apparatus according to claim 4, wherein heating by the heater is performed in a state the gate valve of the transfer chamber is opened.

7. The film formation apparatus according to claim 1, wherein the heater removes moisture in the chamber by producing the inductively coupled plasma in the processing space of the heater and heating inside the chamber via the rotation table in the state in which the workpiece is not loaded on the rotation table.

8. The film formation apparatus according to claim 7, wherein the heater comprises:
- a processing gas introducer which introduces a processing gas in the processing space of the heater; and
- a plasma producer which produces the inductively coupled plasma in the processing space of the heater to which the processing gas was introduced.

9. The film formation apparatus according to claim 7, wherein:
- a transfer chamber which carries the workpiece into and out of the chamber and is connected to the chamber via a gate valve, and
- a refrigerator is provided to the transfer chamber.

10. The film formation apparatus according to claim 1, further comprising:
- a gas analyzer that measures a component amount of gas included in an exhaustion from the chamber, wherein the controller is further configured to control the heater based on the component amount of gas measured by the gas analyzer.

11. The film formation apparatus according to claim 1, wherein the controller is further configured to control:
- after performing heating by the heater, the carrier to circularly carry the workpiece by the rotation table;
- the film formation processor to perform film formation processing by sputtering on the workpiece which is circularly carried, and
- the heater to perform film processing relative to the film produced on the workpiece by the film formation processor by producing the inductively coupled plasma in the processing space of the heater.

12. The film formation apparatus according to claim 1, wherein the controller is configured to control the heater to stop production of the plasma based on one of:
- a processing time determined based upon removal of moisture in the processing space of the heater,
- gas analysis of the moisture level in the processing space of the heater, and
- a pressure in the processing space of the heater based upon removal of the moisture in the processing space of the heater.

13. The film formation apparatus according to claim 1, wherein the moisture level in the processing space of the heater comprises a moisture related component including at least one of water, hydrogen, and a hydroxyl group.

\* \* \* \* \*